United States Patent [19]
Raad

[11] Patent Number: 5,905,686
[45] Date of Patent: *May 18, 1999

[54] FAST SENSE AMPLIFIER FOR SMALL VOLTAGE DIFFERENCES

[75] Inventor: George B. Raad, Boise, Id.

[73] Assignee: Micron Technology, Inc., Boise, Id.

[*] Notice: This patent is subject to a terminal disclaimer.

[21] Appl. No.: 09/010,730

[22] Filed: Jan. 22, 1998

Related U.S. Application Data

[63] Continuation of application No. 08/800,963, Feb. 18, 1997, Pat. No. 5,768,202.

[51] Int. Cl.[6] ...................................................... G11C 7/00
[52] U.S. Cl. .......................... 365/207; 365/208; 327/51
[58] Field of Search .................................. 365/205, 206, 365/207, 189.05; 327/51

[56] References Cited

U.S. PATENT DOCUMENTS

| | | | |
|---|---|---|---|
| 4,907,201 | 3/1990 | Minami et al. | 365/207 |
| 5,023,841 | 6/1991 | Akrout et al. | 365/205 |
| 5,646,880 | 7/1997 | Yuh | 365/149 |
| 5,708,616 | 1/1998 | Choi | 365/207 |

OTHER PUBLICATIONS

Kim, J.S., et al., "A Triple Level Matallization Technique for Gigabit Scaled DRAMS", Jun. 18–20, 1996 VMIC Conference, 1996 ISMIC, 28–33, (Jun., 1996).

Lee, K.C., et al., "Low Voltage High Speed Circuit Designs for Giga–bit DRAMs", 1996 Symposium on VLSI Circuits Digest of Technical Papers, IEEE, 104–105, (1996).

*Primary Examiner*—Son T. Dinh
*Attorney, Agent, or Firm*—Schwegman, Lundberg, Woessner & Kluth, P.A.

[57] ABSTRACT

A sense amplifier senses a small voltage differential across true and complementary digit lines in a dynamic random access memory (DRAM) integrated circuit. The sensed voltage is further separated and amplified into full logic levels. Activating the P-sense amplifier before the N-sense amplifier speeds sensing. The P-sense amplifier control signal is capacitively coupled to each of the true and complementary digit lines. The P-sense amplifier further increases the more positive digit line to the power supply voltage $V_{cc}$. The other digit line is at a voltage more positive than its equilibration voltage, speeding conduction of a subsequently activated N-sense amplifier, particularly for low values of $V_{cc}$, in which the threshold voltages of the NFETs in the N-sense amplifier are close to the equilibration voltage. Capacitor elements need not be added to the sense amplifier layout.

25 Claims, 9 Drawing Sheets

FAST SENSE AMPLIFIER FOR SMALL VOLTAGE DIFFERENCES

This application is a continuation of U.S. patent application Ser. No. 08/800,963, filed Feb. 18, 1997, now U.S. Pat. No. 5,768,202.

FIELD OF THE INVENTION

This invention relates to a sense amplifier for an integrated circuit memory such as a dynamic random access memory (DRAM).

BACKGROUND

Semiconductor memory manufacturing technology allows the creation of high density memory arrays on an integrated circuit chip. Such memory arrays consist of many memory cells, each cell capable of storing one data bit.

A dynamic random access memory (DRAM) includes an arrangement of such memory cells. Each memory cell comprises a storage capacitor for storing a data bit as a charge and an access transistor for accessing the charge. The data bit charge provides either a binary logic high (high) voltage or a binary logic low (low) voltage. Data is stored in the memory cells during a write mode and retrieved during a read mode. The data is transmitted to and from the memory cells on signal lines, referred to as bit lines or digit lines. The digit lines are coupled to input/output (I/O) lines through I/O transistors used as switches. Each memory cell provides, through a true digit line, the logic state of its stored data bit to a corresponding I/O line. Each memory cell also provides, through a corresponding complimentary digit line, the complementary logic state of its stored data bit to a corresponding I/O complement line. The true digit line and corresponding complimentary digit lines are referred to collectively as a digit line pairs.

The memory cells are typically arranged in an array and each memory cell has an address identifying its location in the array. The array comprises a configuration of intersecting rows and columns. A memory cell is associated with each intersection. In order to read from or write to a memory cell, that memory cell must be selected, or addressed. A row decoder activates a word line in response to a specified row address. The activated word line turns on the access transistors for each memory cell of the row. A column decoder selects a digit line pair in response to a specified column address. For a read operation the selected word line activates the access transistors for all memory cells in the row, and the column decoder couples the data of a particular memory cell onto a corresponding digit line pair.

As set forth above, DRAM memory cells use storage capacitors to store data. A logical high, or logical "1", is stored as a charge on the capacitor. The capacitor is discharged for a logical low, or logical "0". Digit line pairs are fabricated as metal lines on the integrated circuit and connected to the memory cells for communicating data stored in the memory cells.

For reading data, the digit line pairs are first equilibrated to the same voltage. Charge from a particular memory cell is coupled, for example, onto a true digit line, resulting in a small differential voltage between the true digit line and its corresponding complimentary digit line. A sense amplifier senses the small differential voltage across the digit line pair, and further increases the voltage differential to full logic levels for communication to the corresponding I/O lines.

To obtain faster circuit operation, there is a need for sense amplifiers that reduce the time required for reading data from a particular memory cell. For the reasons stated above, and for other reasons stated below which will become apparent to those skilled in the art upon reading and understanding the present specification, there is a need in the art for faster sense amplifiers.

SUMMARY

The present invention includes a sense amplifier and method of sensing a small differential voltage between first and second nodes having respective first and second node voltages. A first sense amplifier is activated, in response to a first sense amplifier control signal, for further increasing the more positive of the first and second node voltages. Upon the step of activating the first sense amplifier, the first and second node voltages is increased by a substantially identical amount. A second sense amplifier is then activated, in response to a second sense amplifier control signal, for further decreasing the more negative of the first and second node voltages.

The sense amplifier, for sensing a small differential voltage between first and second nodes having respective first and second node voltages, includes respective first and second sense amplifiers. The first sense amplifier is electrically coupled to each of the first and second nodes and to a first sense amplifier control signal. The first sense amplifier is used for further increasing the more positive of the first and second node voltages. The second sense amplifier is electrically coupled to each of the first and second nodes and to a second sense amplifier control signal. The second sense amplifier is used for decreasing the more negative of the first and second node voltages. A first capacitor is electrically coupled between the first amplifier control signal and the first node, for increasing the first node voltage. A second capacitor is electrically coupled between the first amplifier control signal and the second node, for increasing the second node voltage.

BRIEF DESCRIPTION OF THE DRAWINGS

In the drawings, like numerals describe like components throughout the several views.

DETAILED DESCRIPTION

The present invention includes a fast sense amplifier and method of quickly sensing and amplifying a small differential voltage between two nodes, such as between true and complementary digit lines on a dynamic random access memory (DRAM) integrated circuit.

In the following detailed description, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
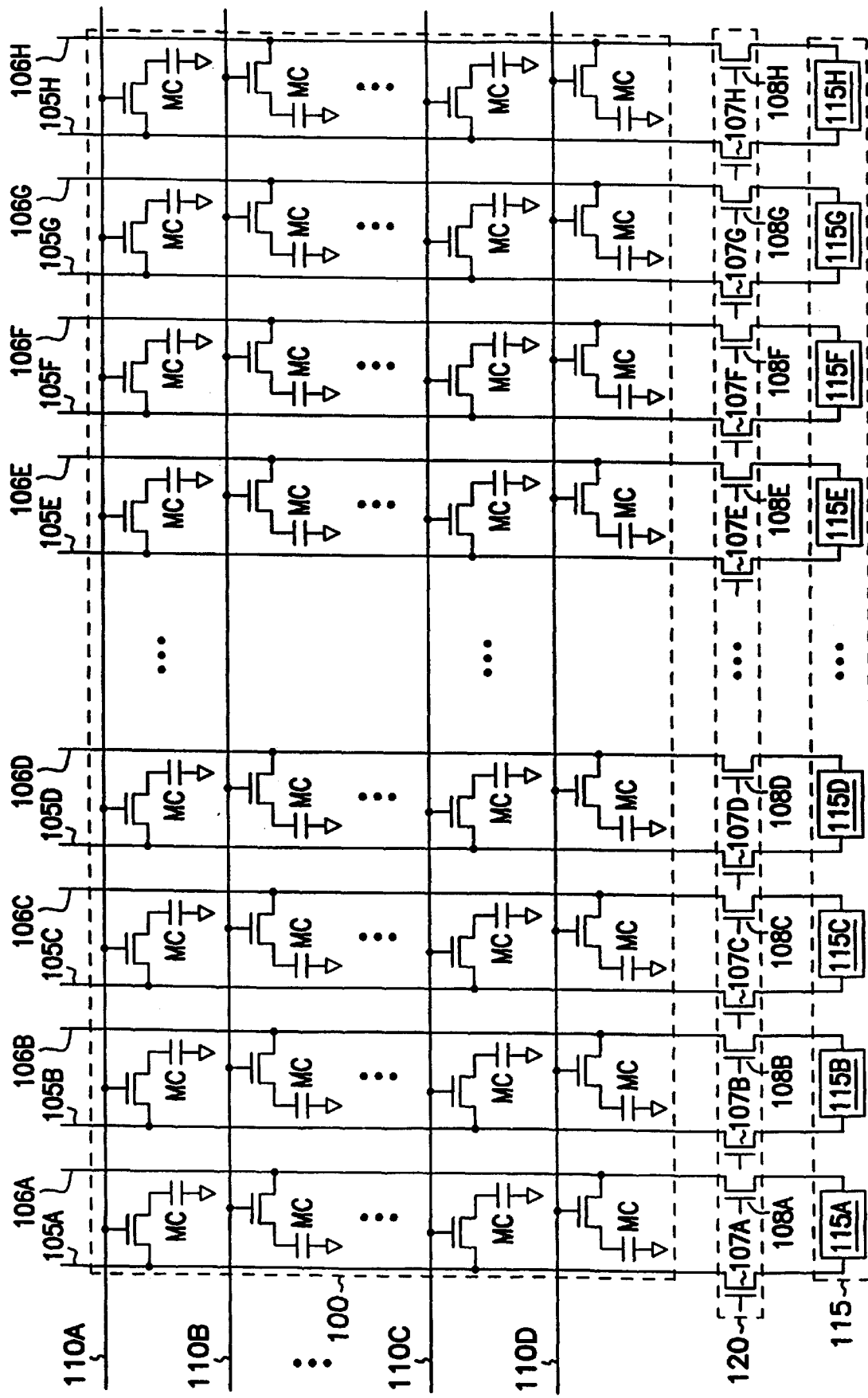
FIG. 1 is a schematic diagram illustrating a portion of a prior art dynamic random access memory (DRAM) cell array, isolation transistors, and sense amplifiers.

FIG. 1 illustrates generally one embodiment of a portion of a prior art dynamic random access memory (DRAM) array. A memory cell array 100 is illustrated generally, comprising individual memory cells that are each designated as MC. Each memory cell is comprised of a memory cell storage capacitor and a cell access field effect transistor (FET).

In FIG. 1, the gate terminals of the cell access FETs are each coupled to one of word lines 110A-D, generally designated 110. Word lines 110 are controlled by a row decoder that activates a particular word line determined by a row address. The storage capacitor stores binary data as a quantity of charge. The cell access FETs act as switches to transfer charge between the storage capacitors and their respective digit lines 105, 106. Each memory cell is coupled to either a true digit line 105A-H or a complimentary digit line 106A-H. The true and complimentary digit lines are referred to generally as digit lines 105, 106, and each digit line 105, 106 has a corresponding true or complementary isolation FET 107A-H, 108A-H for isolating the memory cell array 100 from other DRAM circuits.

In FIG. 1, the cell access FET acts as a switch having two states. The particular state of the cell access FET is determined by a control voltage at a gate terminal of the cell access FET. In one state, the cell access FET electrically couples the memory cell storage capacitor to a digit line 105, 106. In the other state, the cell access FET electrically isolates the memory cell storage capacitor from the digit line 105, 106. In FIG. 1, dotted lines indicate generally other instantiations of memory cells and digit lines which are not illustrated in FIG. 1.

In reading data from a particular memory cell, a voltage difference is sensed by one of sense amplifiers 115A-H, collectively 115, between a true digit line 105 to which the particular memory cell is coupled and a corresponding complimentary digit line 106. For example, in reading data from a memory cell coupled to true digit line 105A, isolation FETs 107A and 107B are turned on. Through isolation FETs 107A and 107B, sense amplifier 115A then senses a voltage difference between true digit line 105A and corresponding complimentary digit line 106A, as set forth below.

First, true digit line 105A and its corresponding complimentary digit line 106A are equilibrated. A substantially equal voltage is created on the true digit line 105A and its corresponding complimentary digit line 106A. Next, a voltage is delivered to word line 110A to activate each memory access transistor having a gate terminal connected to word line 110A. Since no memory access transistor having a gate terminal connected to word line 110A is connected to a complementary digit line 106 these complementary digit lines 106 remain isolated from their corresponding memory cells. Of the activated memory access transistors, a single memory access transistor couples a memory cell storage capacitor onto true digit line 105A.

Referring exclusively to true digit line 105A and corresponding complementary digit line 106A, by way of example, charge is transferred between a single memory cell capacitor and true digit line 105A, thereby perturbing the voltage on true digit line 105A. The resulting small voltage differential between true digit line 105A and complementary digit line 106A is sensed by sense amplifier 115A coupled between true digit line 105A and complementary digit line 106A. Sense amplifier 115A further separates this voltage difference between true digit line 105A and complementary digit line 106A.

Data may analogously be read from memory cells coupled to a complementary digit line 106 by activating a word line 110 which couples memory cells onto a complementary digit line 106. For example, by activating word line 110B (FIG. 1), data is coupled onto complementary digit lines 106A-H.

Figure 2:
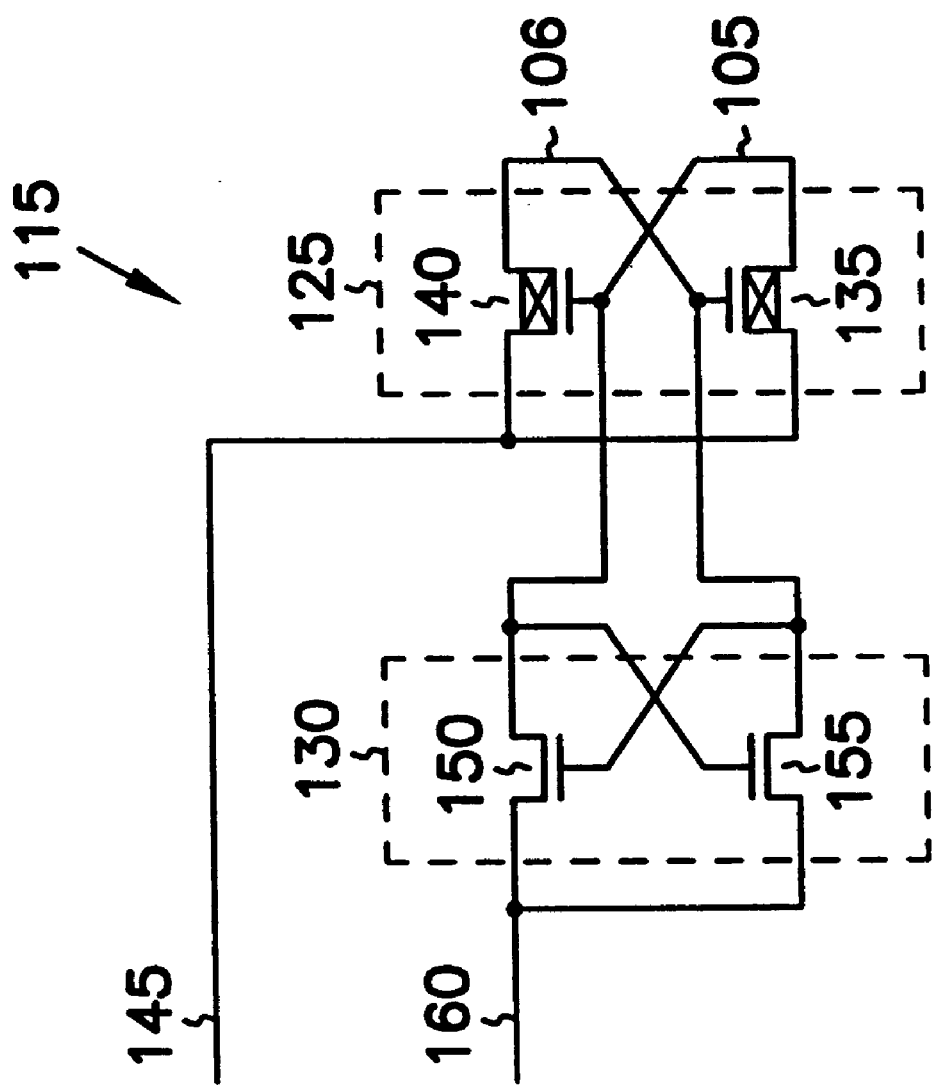
FIG. 2 is a schematic illustration of a prior art sense amplifier.

FIG. 2 is a schematic diagram illustrating a conventional sense amplifier 115 for amplifying a voltage difference between a first node, such as a true digit line 105, and a second node, such as a complementary digit line 106. Sense amplifier 115 includes first and second sense amplifiers 125 and 130, respectively.

In FIG. 2, first sense amplifier 125 is a P-sense amplifier comprising first and second p-channel field-effect transistors (PFETs) 135 and 140. First PFET 135 includes a drain terminal electrically coupled to true digit line 105, a source terminal electrically coupled to a first sense amplifier control signal 145, and a gate terminal electrically coupled to complementary digit line 106. Second PFET 140 includes a drain terminal electrically coupled to complementary digit line 106, a source terminal electrically coupled to the first sense amplifier control signal 145, and a gate terminal electrically coupled to the true digit line 105.

In FIG. 2, second sense amplifier 130 is an N-sense amplifier comprising first and second n-channel field-effect transistors (NFETs) 150 and 155. First NFET 150 includes a drain terminal electrically coupled to true digit line 105, a source terminal electrically coupled to a second sense amplifier control signal 160, and a gate terminal electrically coupled to complementary digit line 106. Second NFET 155 includes a drain terminal electrically coupled to complementary digit line 106, a source terminal electrically coupled to the second sense amplifier control signal 160, and a gate terminal electrically coupled to true digit line 105.

Figure 3:
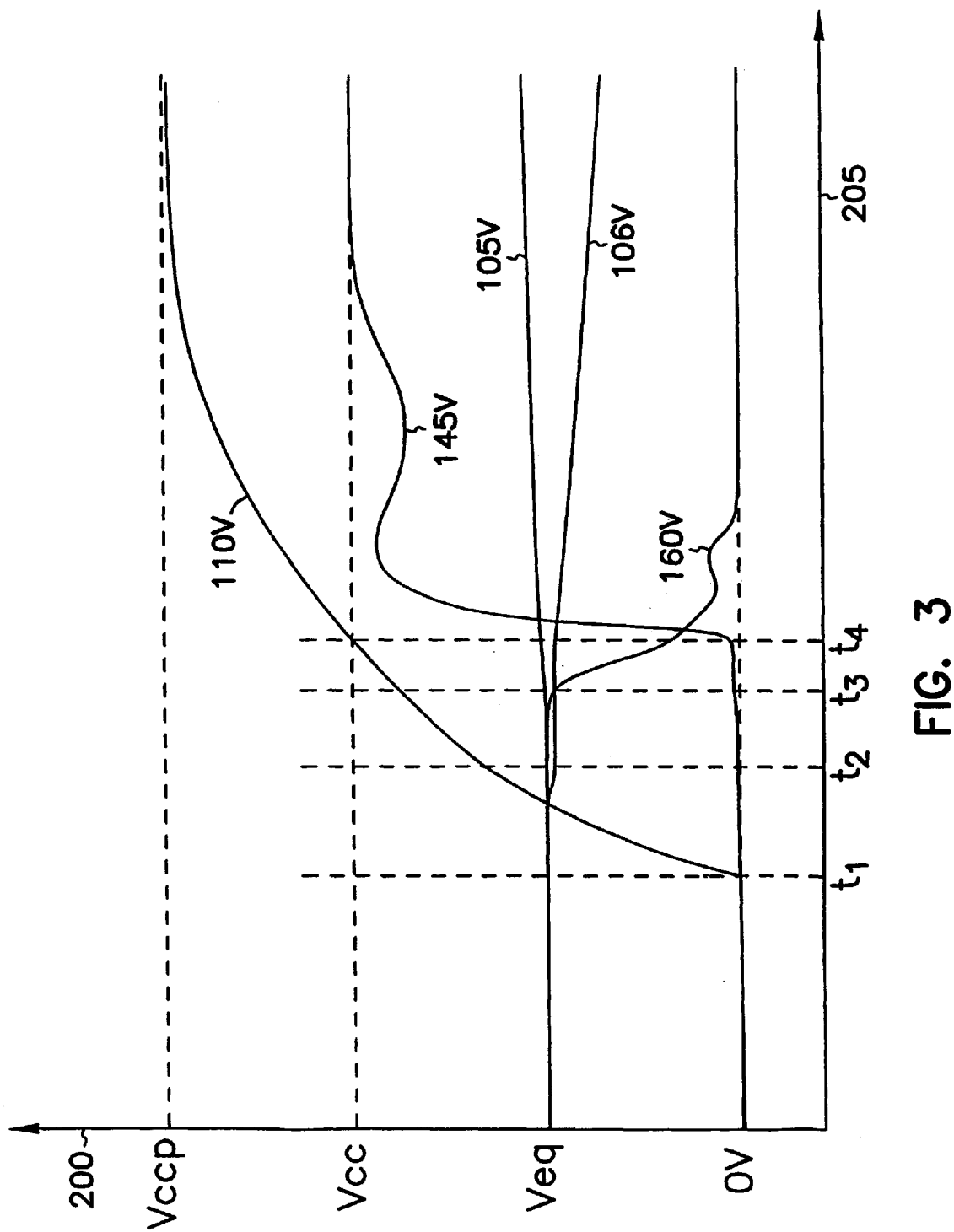
FIG. 3 is a graph of voltage vs. time waveforms of several nodes in the prior art sense amplifier of FIG. 2 during equilibration, reading, and amplification.

FIG. 3 illustrates generally the voltage waveforms during operation of the conventional sense amplifier 115 of FIG. 2. FIG. 3 includes voltage axis 200, time axis 205, the voltage 145 V of the first amplifier control signal 145, the voltage 160 V of the second amplifier control signal 160, the voltage 105 V of the true digit line 105, the voltage 106 V of the complementary digit line 106, and voltage 110 V of a word line 110.

As described above, the true and complementary digit lines voltages 105 V and 106 V, respectively, are equilibrated to the same equilibrate voltage $V_{eq}$ during the time prior to $t_1$. $V_{eq}$ is typically approximately equal to half the positive power supply voltage $V_{cc}$. During this time, the second sense amplifier control signal voltage 160 V is also equilibrated to $V_{eq}$, and first sense amplifier control signal voltage 145 V is approximately equal to the ground voltage of 0 V.

At time $t_1$ in FIG. 3, charge from a particular memory cell is, for example, coupled onto true digit line 105 by activating a word line 110, causing a small difference between true and complementary digit lines voltages 105 V and 106 V by time $t_2$. At time $t_3$, second sense amplifier control signal voltage 160 V is changed from $V_{eq}$ to approximately that of the negative power supply voltage, e.g. ground voltage. This causes the more negative one of the true and complementary digit line voltages 105 V and 106 V, respectively, to be further decreased toward the ground voltage. FIG. 3 illustrates, by way of example, the case where it is the complementary digit line voltage 106 V that is further decreased toward the ground voltage.

At time $t_4$, the first sense amplifier control signal voltage 145 V is changed from 0 V to $V_{cc}$. This causes the more positive one of the true and complementary digit lines voltages 105 V and 106 V to be farther increased in voltage toward $V_{cc}$. FIG. 3 illustrates, by way of example, the case where it is the true digit line voltage 105 V that is further increased toward $V_{cc}$. In this way, a small voltage difference between respective true and complimentary digit lines 105 and 106 is separated into fill logic levels for reading by other circuits, such as peripheral circuits on the DRAM.

Figure 4:
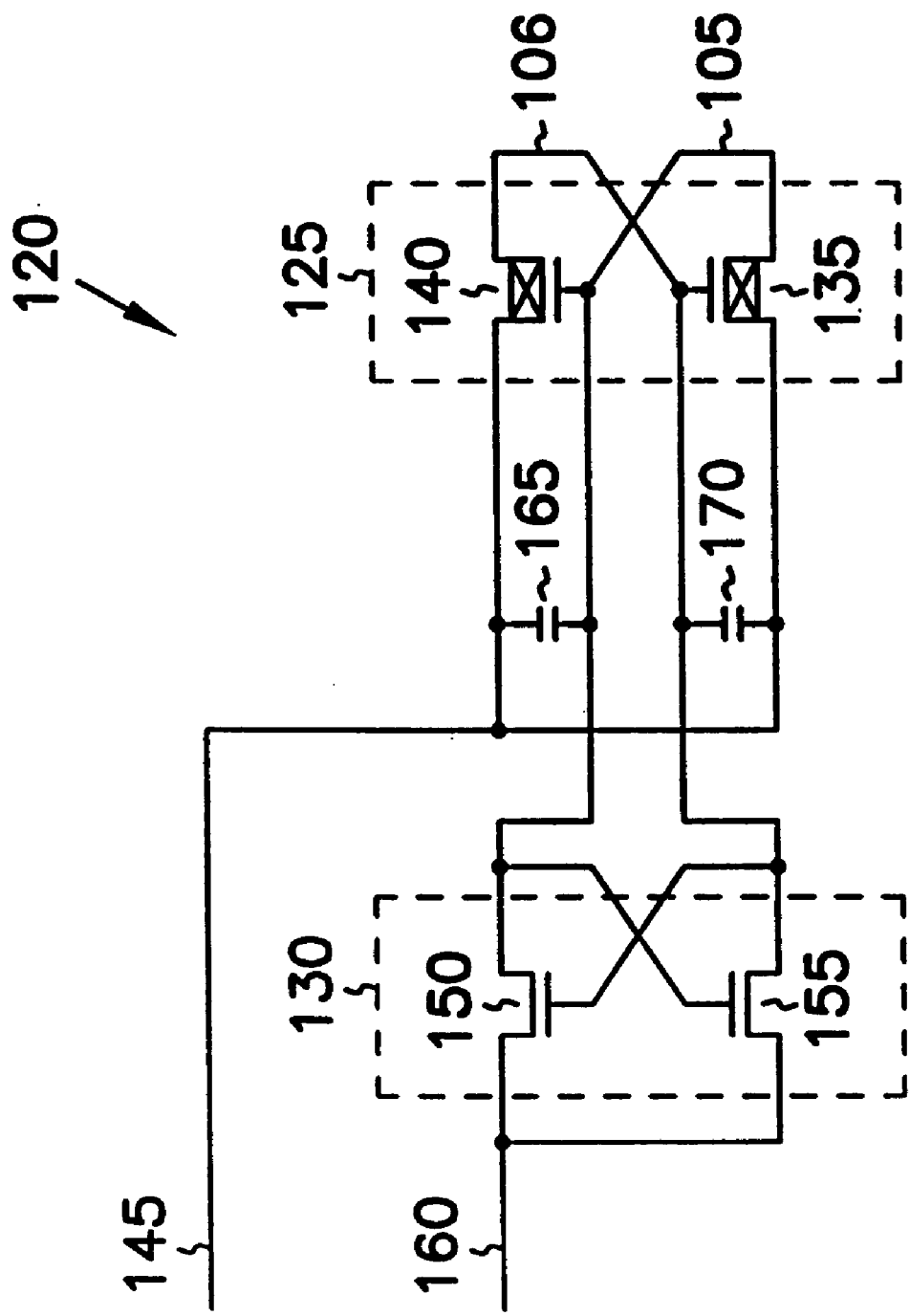
FIG. 4 is a schematic illustration of a sense amplifier according to the present invention.

FIG. 4 is a schematic diagram illustrating the sense amplifier 120 according to the present invention. According to the present invention, a sense amplifier 120 replaces each conventional sense amplifier 115 in FIG. 1. Sense amplifier 120 offers significant advantages over conventional sense amplifier 115, as described below. Sense amplifier 120 is useful for amplifying any small voltage difference between a first node, such as a true digit line 105, and a second node, such as a complementary digit line 106. Sense amplifier 120 includes first and second sense amplifiers 125 and 130, respectively.

In FIG. 4, first sense amplifier 125 is a P-sense amplifier comprising first and second p-channel field-effect transistors (PFETs) 135 and 140. First PFET 135 includes a drain terminal electrically coupled to true digit line 105, a source terminal electrically coupled to a first sense amplifier control signal 145, and a gate terminal electrically coupled to complementary digit line 106. Second PFET 140 includes a drain terminal electrically coupled to complementary digit line 106, a source terminal electrically coupled to the first sense amplifier control signal 145, and a gate terminal electrically coupled to the true digit line 105.

In FIG. 4, second sense amplifier 130 is an N-sense amplifier comprising first and second n-channel field-effect transistors (NFETs) 150 and 155. First NFET 150 includes a drain terminal electrically coupled to true digit line 105, a source terminal electrically coupled to a second sense amplifier control signal 160, and a gate terminal electrically coupled to complementary digit line 106. Second NFET 155 includes a drain terminal electrically coupled to complementary digit line 106, a source terminal electrically coupled to the second sense amplifier control signal 160, and a gate terminal electrically coupled to true digit line 105.

In FIG. 4, sense amplifier 120 also includes first capacitor 165 electrically coupled between the first node, such as true digit line 105, and the first amplifier control signal 145. Sense amplifier 120 also includes second capacitor 170 electrically coupled between the second node, such as complementary digit line 106, and the first amplifier control signal 145. First and second capacitors 165 and 170, respectively, are used for coupling the first amplifier control signal 145 to each of the true and complementary digit lines 105 and 106, respectively. This advantageously increases the voltage separation rate of true and complementary digit lines 105 and 106, as described below.

Figure 5:
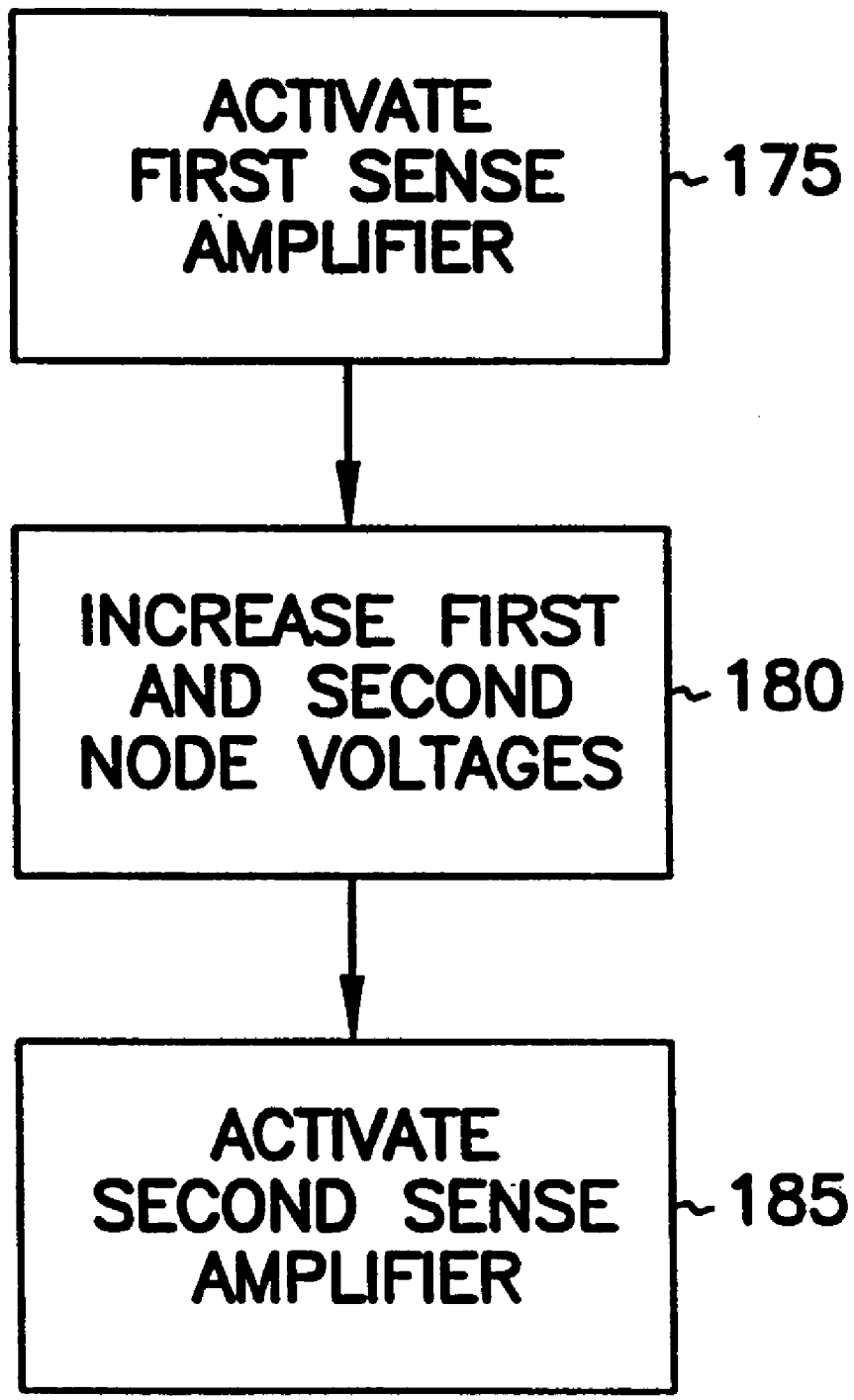
FIG. 5 is a flow chart describing steps within the method of using the sense amplifier according to the present invention.

FIG. 5 is a flow chart illustrating steps within the method of using the sense amplifier 120 according to the present invention. First and second node voltages, corresponding to true and complementary digit lines 105 and 106, are equilibrated. Next, a data bit is coupled onto one of true and complementary digit lines 105 and 106, resulting in a small voltage differential therebetween. Next, at step 175, the first sense amplifier is activated, in response to a first sense amplifier control signal, for further increasing the more positive of the true and complementary digit lines 105 and 106. Upon step 175, the voltages of the true and complementary digit lines 105 and 106 are increased by a substantially identical amount. Next, at step 185, the second sense amplifier is activated, in response to a second sense amplifier control signal, for further decreasing the more negative of the voltages of the true and complementary digit lines 105 and 106.

Figure 6:
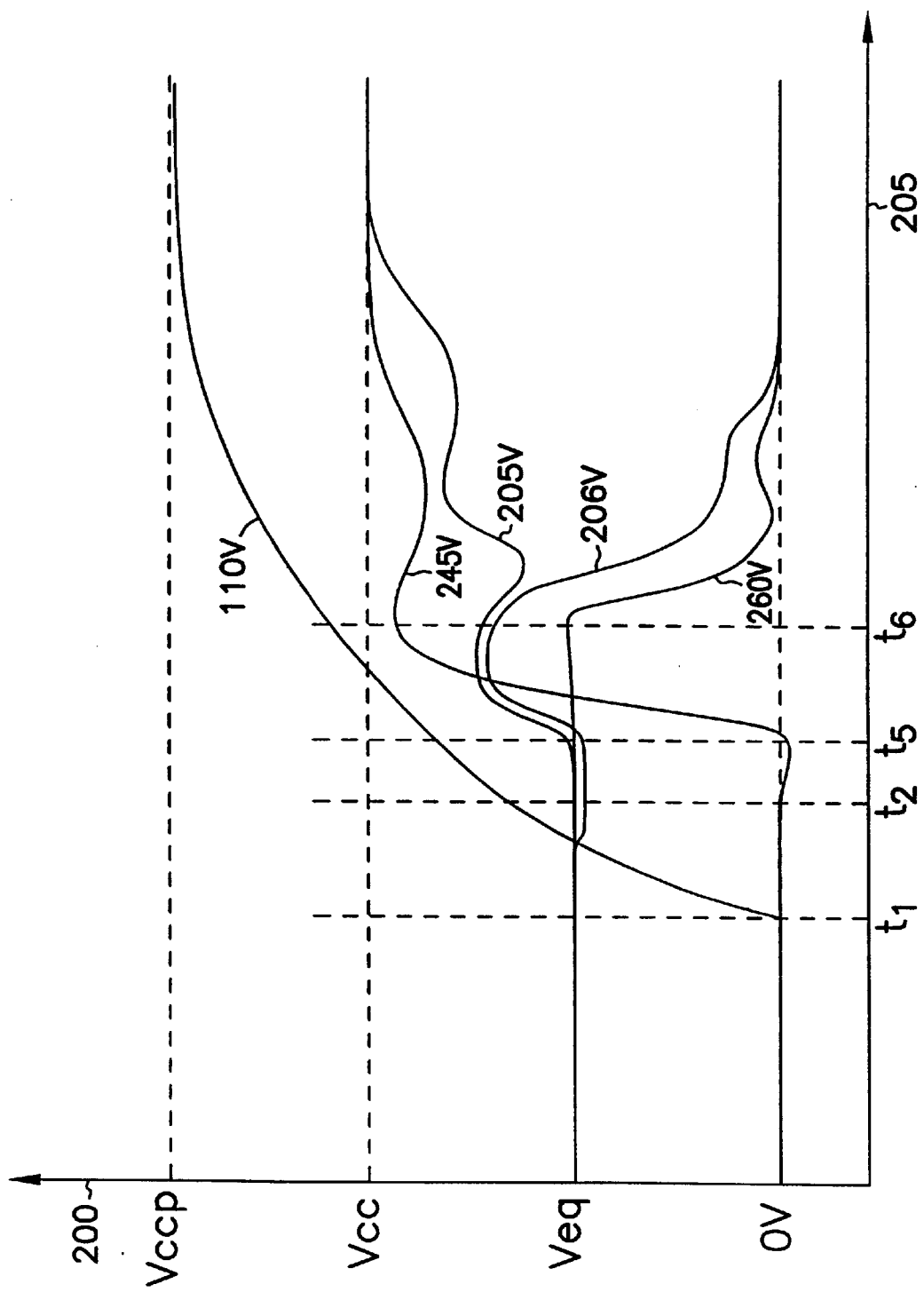
FIG. 6 is a graph of voltage vs. time waveforms of several nodes in the sense amplifier of FIG. 4 during equilibration, reading, and amplification.

FIG. 6 illustrates generally the voltage waveforms during operation of the sense amplifier 120 of the present invention as depicted in FIG. 4. FIG. 6 includes voltage axis 200, time axis 205, the voltage 245 V of the first amplifier control signal 145, the voltage 260 V of the second amplifier control signal 160, the voltage 205 V of the true digit line 105, the voltage 206 V of the complementary digit line 106, and the voltage 110 V of a word line 110.

As described above, true and complementary digit line voltages 205 V and 206 V, respectively, are equilibrated to $V_{eq}$ prior to time $t_1$. During this time, the second amplifier control signal voltage 260 V is also at $V_{eq}$, and the first amplifier control signal voltage 245 V is at approximately the ground voltage of 0 V. At time $t_1$, a word line 110 is activated, i.e. its voltage is increased from the ground voltage to a word line power supply voltage, $V_{ccp}$, that typically exceeds the power supply voltage $V_{cc}$ by approximately 1.5 Volts. Activation of word line 110 results in the coupling of charge from a particular memory cell onto, for example, true digit line 105, causing a small difference between true and complementary digit line voltages 205 V and 206 V by time $t_2$.

According to the present invention, the first sense amplifier control signal voltage 245 V is changed from approximately 0 V to approximately $V_{cc}$ at time $t_5$. This causes both of true and complementary digit line voltages 205 V and 206 V, respectively, to be increased toward $V_{cc}$ by capacitive coupling between the first sense amplifier control signal 145 and each of true and complementary digit lines 105 and 106, respectively, through respective first and second capacitors 165 and 170. The more positive one of true and complementary digit line voltages 205 V and 206 V is further increased toward $V_{cc}$ by first sense amplifier 125, as described above. FIG. 6 illustrates, by way of example, the case where it is the true digit line voltage 205 V that is further increased toward the positive power supply $V_{cc}$.

In FIG. 6, the second sense amplifier control signal voltage 260 V is changed from approximately $V_{eq}$ to approximately 0 V at time $t_6$. This causes the more negative one of true and complementary digit line voltages 205 V and 206 V to be further decreased toward 0 V by second sense amplifier 130. FIG. 6 illustrates, by way of example, the case where it is the complementary digit line voltage 206 V that is further increased toward 0 V.

FIG. 6 illustrates an advantage of the present invention: faster separation of true and complementary digit line voltages 205 V and 206 V, respectively. The capacitive coupling of the first amplifier control signal 145 through first and second capacitors 165 and 170, respectively, increases true and complementary digit line voltages 205 V and 206 V, respectively. This speeds operation of the first sense amplifier 125 in further increasing the more positive one of the true and complementary digit line voltages 205 V and 206

V toward 0 V. This also speeds operation of second sense amplifier 130 in further deceasing the more negative one of the true and complementary digit line voltages 205 V and 206 V toward 0 V, as explained below.

Second sense amplifier 130 operates by respective first and second NFETs 150 and 155. Respective first and second NFETs 150 and 155 require at least a threshold voltage, $V_T$, between their respective gate and source terminals for conduction. Increasing the voltage between the gate and source terminals of each of first and second NFETs 150 and 155 improves their conduction and speeds operation of second sense amplifier 130. As described above, the first and second capacitors 165 and 170 increase each of the true and complementary digit line voltages 205 V and 206 V toward $V_{cc}$ by capacitive coupling. However, first and second capacitors are not required. Speed improvement in the second sense amplifier may be obtained by increasing the voltage between the gate and source terminals of each of first and second NFETs 150 and 155 by other techniques. In one such alternative technique, first sense amplifier 125 is activated before second sense amplifier 130. By so doing, the first and second PFETs 135 and 140 increase each of the true and complementary digit line voltages 205 V and 206 V not by capacitive coupling, but by drain-source current conduction. Since first and second PFETs 135 and 140 will begin to conduct when first sense amplifier 125 is activated, the voltage between the gate and source terminals of each of first and second NFETs 150 and 155 is increased prior to activation of second sense amplifier 130. When second sense amplifier 130 is subsequently activated, the conduction of first and second NFETs 150 and 155 is improved, thereby speeding operation of second sense amplifier 130. In such a case, activating first sense amplifier 125 before second sense amplifier 130 improves speed by conductive rather than capacitive means.

As DRAM dimensions are scaled downward to increase memory cell density, $V_{cc}$ is typically reduced to maintain manageable electric fields and also to reduce power consumption. Reduction of $V_{cc}$, in turn reduces the equilibration voltage $V_{eq}$ toward the threshold voltage $V_T$. The present invention, by increasing the voltage between the gate and source terminals of each of first and second NFETs 150 and 155, improves their conduction. This speeds operation of second sense amplifier 130 in further decreasing the more negative one of the true and complementary digit line voltages 205 V and 206 V toward 0 V.

In the above-described embodiment of FIG. 6, the typical power supply voltage $V_{cc}$ is approximately 2.0 Volts, although a much wider range of voltages could also be used, such as approximately between 1.5 Volts and 5 volts. The threshold voltage $V_T$ of first and second NFETs 150 and 155 is typically approximately 0.7 Volts, but may vary, such as approximately between 0.5 volts and 0.9 Volts due to process variations. The threshold voltage $V_T$ of the first and second PFETs 135 and 140 is typically approximately 0.9 Volts, but may vary, such as approximately between 0.7 Volts and 1.0 Volts due to process variations.

As described above, a small voltage difference between respective true and complimentary digit lines 105 and 106 is amplified into full logic levels for reading by other DRAM circuits. It should be noted that the above described technique does not require any additional control signal for simultaneously increasing both the true and complementary digit line voltages 205 V and 206 V; the first amplifier control signal 145 is advantageously used for this purpose.

Figure 7:
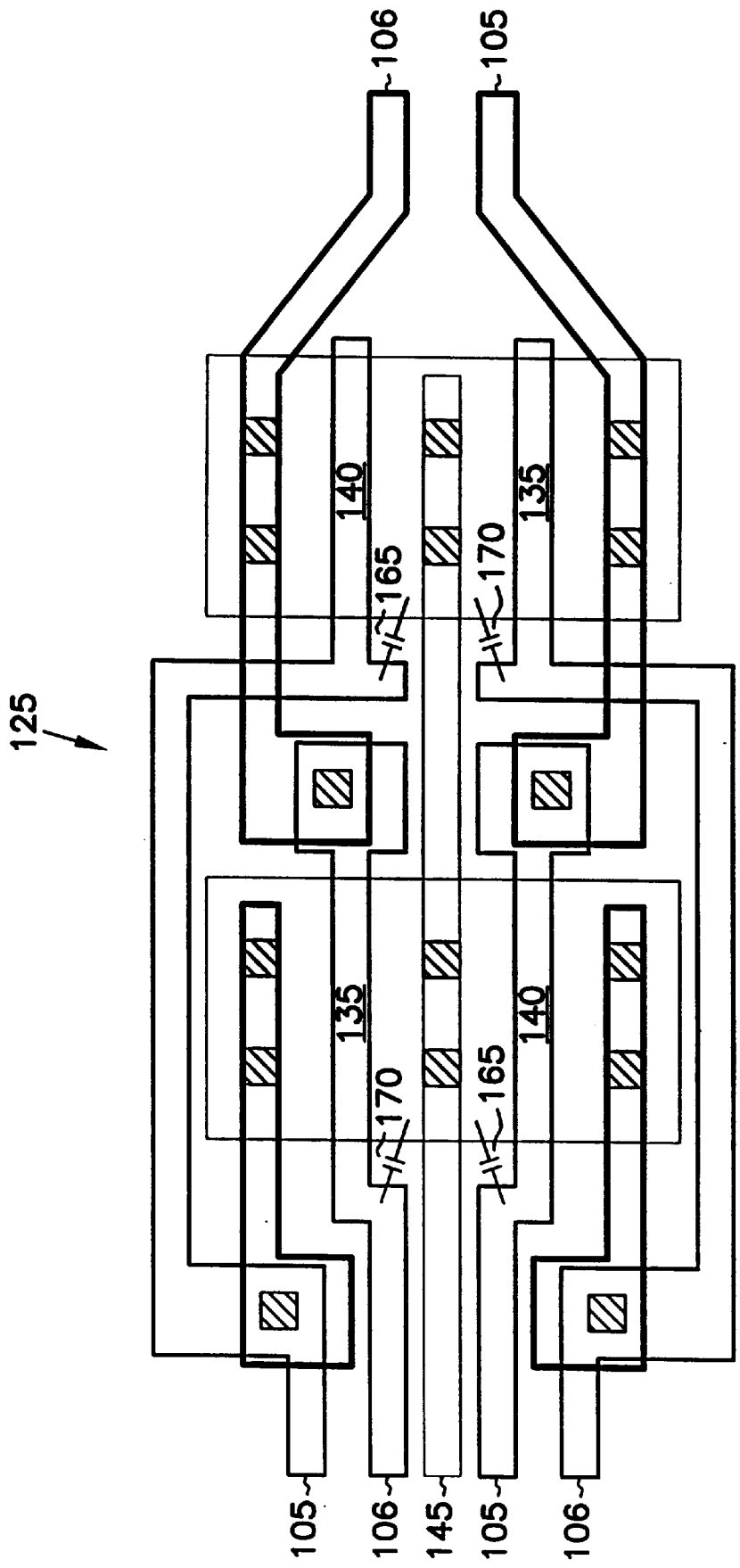
FIG. 7 is a mixed layout and schematic diagram illustrating a first embodiment of the sense amplifier of FIG. 4.

FIG. 7 is a mixed layout and schematic representation of a portion of the present invention. FIG. 7 includes first-sense amplifier 125, which is a P-sense amplifier comprising first and second PFETs 135 and 140, so labeled over their respective gate portions. In the embodiment of FIG. 7, each of first and second PFETs 135 and 140 comprises a pair of parallel-connected PFETs, the aggregation of which is arranged in spatial cross-quadrature to optimize transistor matching. However, single instantiations of first and second PFETs 135 and 140 and other arrangements are also possible. In FIG. 7, first amplifier control signal 145 is electrically coupled to the source terminals of each of first and second PFETs 135 and 140. FIG. 7 also illustrates the layout of true and complementary digit lines 105 and 106, having connections as described above in the schematic diagram of FIG. 4.

FIG. 7 also includes schematic representations of first and second capacitors 165 and 170 for identification of their locations. In the embodiment of FIG. 7, each of first and second capacitors 165 and 170 comprises a pair of parallel connected capacitors, the aggregation of which is arranged to correspond to the arrangement of first and second PFETs 135 and 140. First capacitor 165 has a polysilicon terminal, electrically coupled to true digit line 105, and a diffusion terminal, electrically coupled to the first amplifier control signal 145 through the source diffusion of second PFET 140. Second capacitor 170 has a polysilicon terminal, electrically coupled to complementary digit line 106, and a diffusion terminal, electrically coupled to the first amplifier control signal 145 through the source diffusion of first PFET 135.

In FIG. 7, the dielectric between the polysilicon and diffusion terminals of each of first and second capacitors 165 and 170 comprises field-oxide or any other dielectric. The capacitance value of either of first and second capacitors 165 and 170 may be adjusted by varying the separation between its polysilicon terminal and the source diffusion of its associated PFET. Since the field-oxide thickness varies in this bird's beak region, the capacitance value will follow accordingly. In the embodiment of FIG. 7, the value of each of the first and second capacitors 165 and 170 is typically approximately $5 \times 10^{-15}$ Farads, although a much wider range of capacitance values can be implemented, as described below, such as between $3 \times 10^{-15}$ Farads and $7 \times 10^{-15}$ Farads. For comparison, the true and complimentary digit lines each typically have a capacitance to the semiconductor substrate of approximately $250 \times 10^{-15}$ Farads.

Figure 8:
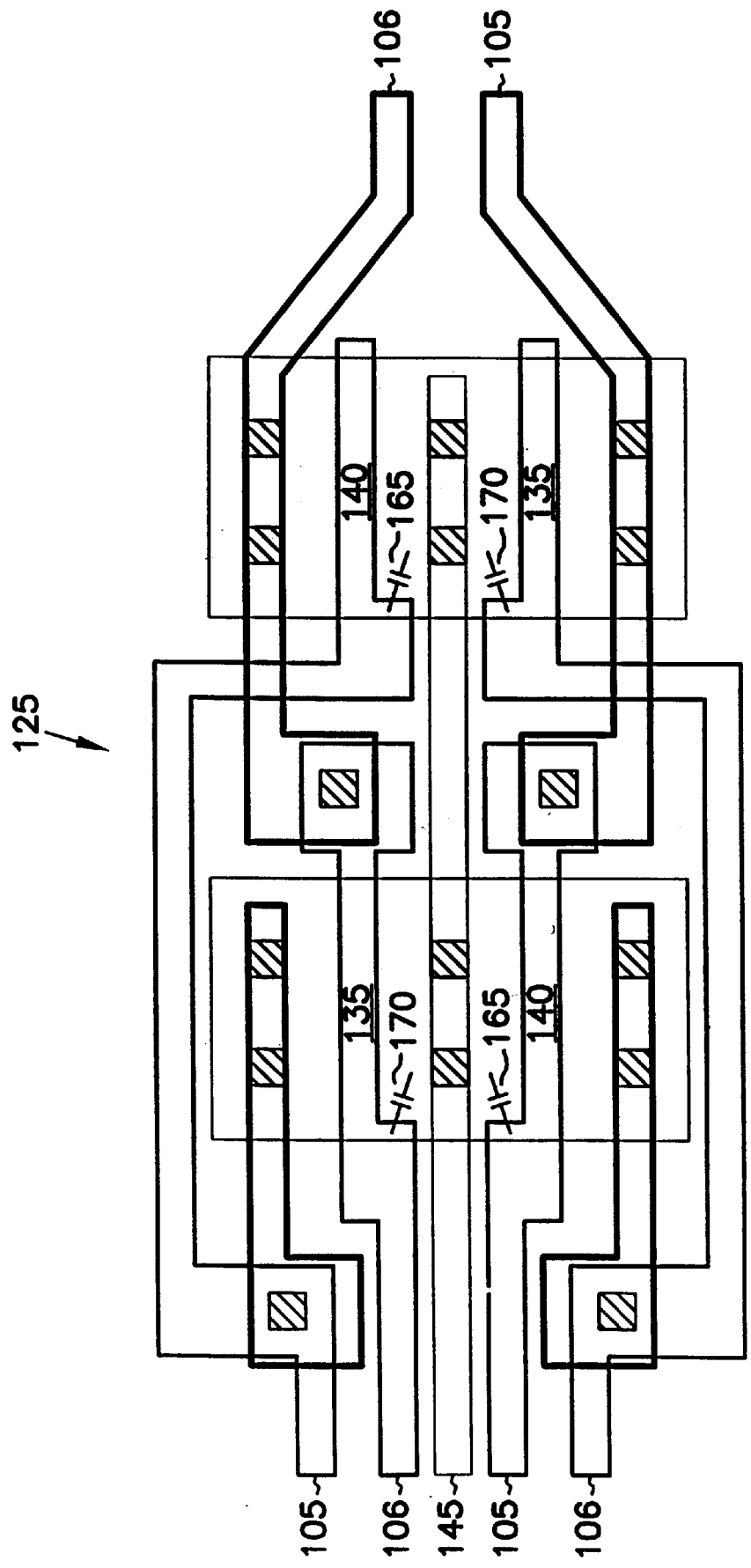
FIG. 8 is a mixed layout and schematic diagram illustrating a second embodiment of the sense amplifier of FIG. 4.

FIG. 8 is a mixed layout and schematic representation of one alternate embodiment of the portion of the present invention illustrated in FIG. 7. In FIG. 8, first and second capacitors 165 and 170 have their respective polysilicon terminals extending over the active area of the source diffusions of each of first and second PFETs 135 and 140. This increases the overlap capacitance between node 145 and each of nodes 105 and 106. In FIG. 8, the dielectric between the polysilicon and diffusion terminals of first and second capacitors 165 and 170 comprises gate oxide or other gate dielectric. The gate oxide is thinner than the field-oxide of FIG. 7, thus FIG. 8 offers increased capacitance value for first and second capacitors 165 and 170.

Figure 9:
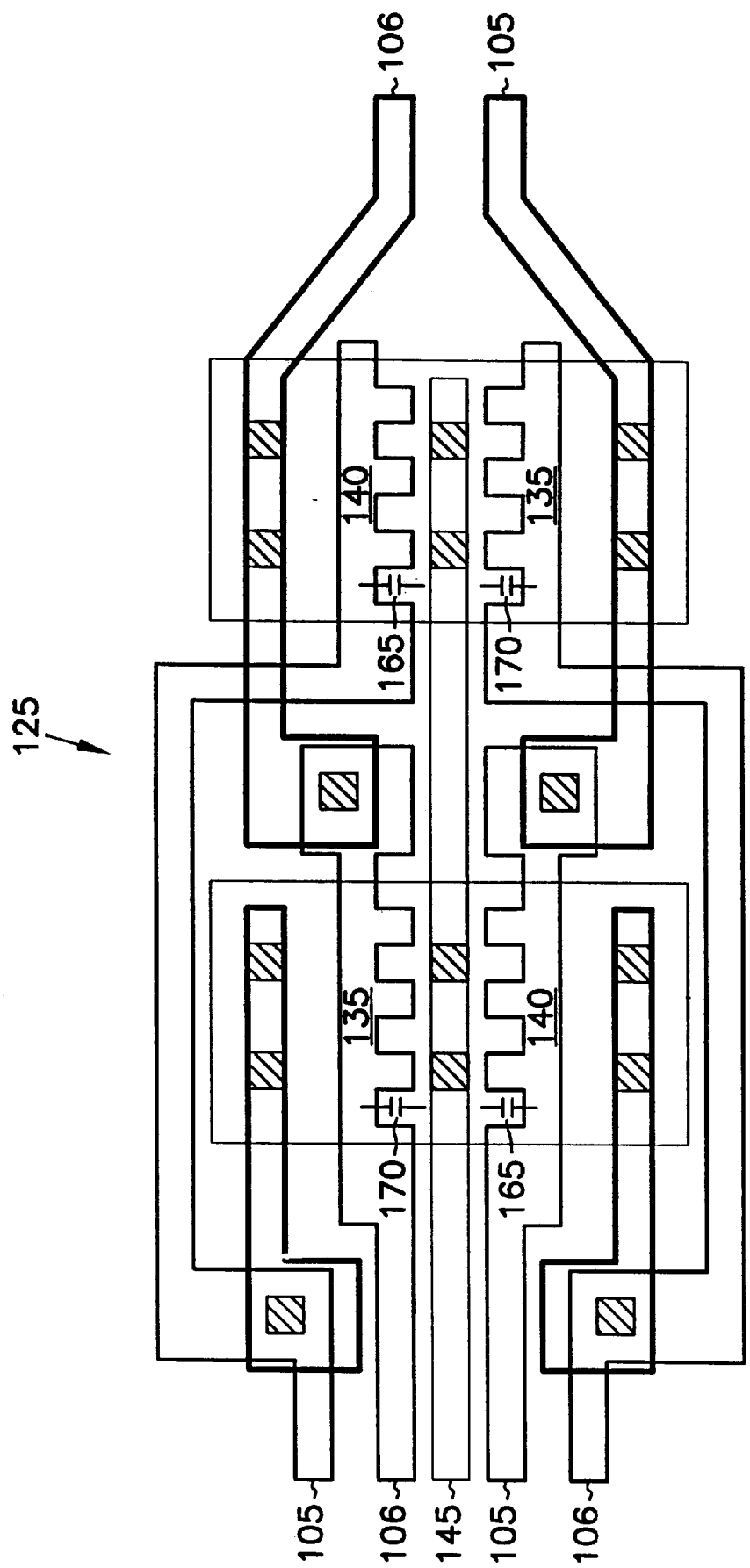
FIG. 9 is a mixed layout and schematic diagram illustrating a third embodiment of the sense amplifier of FIG. 4.

FIG. 9 is a mixed layout and schematic representation of another alternate embodiment of the portion of the present invention illustrated in FIG. 7. In FIG. 9, first and second capacitors 165 and 170 have their respective polysilicon terminals extending over the active area of the source diffusions of each of first and second PFETs 135 and 140. This further increases the overlap capacitance between node 145 and each of nodes 105 and 106. The serpentine edge of the polysilicon terminals of first and second capacitors 165 and 170 provides an increased periphery, and increases the capacitance value of each of first and second capacitors 165 and 170.

Though FIGS. 7 through 9 illustrate the first sense-amplifier 125 portion of the present invention, it is understood that the second-sense amplifier is analogously implemented using NFETs and the corresponding signals with which they are associated.

FIGS. 7 through 9 realize several advantages in their capacitor implementation. In particular, first and second capacitors 165 and 170 use a particular physical arrangement of polysilicon interconnection that is readily available within a sense amplifier layout. Thus, separate implementation of capacitor components is not needed for the present invention. By utilizing the first amplifier control signal 145 for increasing the voltage of each of true and complementary digit lines 105 and 106 through capacitive coupling, no separate control signal is needed. Thus, the present invention minimizes circuit complexity and offers efficient utilization of space on the DRAM integrated circuit die. Also, the present invention obtains a substantially voltage-independent realization of first and second capacitors 165 and 170.

Thus, the above-described invention discloses a fast sense amplifier and method of quickly sensing and amplifying a small differential voltage between two nodes, such as true and complementary digit lines on a dynamic random access memory (DRAM) integrated circuit. As described above, the sense amplifier according to the present invention is particularly useful as the DRAM power supply voltage $V_{cc}$ is lowered to accommodate device scaling and reduction of power consumption.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A method of sensing a differential voltage between first and second nodes having respective first and second node voltages, the method comprising:
   activating a first sense amplifier, in response to a first sense amplifier control signal, for further increasing the more positive of the first and second node voltages;
   increasing the first and second node voltages by a substantially identical amount upon activating the first sense amplifier; and
   activating a second sense amplifier in response to a second sense amplifier control signal, for further decreasing the more negative of the first and second node voltages.

2. The method of claim 1, wherein activating the first sense amplifier further comprises turning on a P-sense amplifier in response to the first sense amplifier control signal.

3. The method of claim 1, wherein increasing the first and second node voltages further comprises capacitively coupling the first sense amplifier control signal to each of the first and second nodes.

4. The method of claim 1, wherein increasing the first and second node voltages further comprises capacitively coupling the first sense amplifier control signal substantially equally to each of the first and second nodes.

5. The method of claim 1, wherein increasing the first and second node voltages further comprises providing current via the first sense amplifier to conductively increase each of the first and second node voltages.

6. The method of claim 1, wherein activating the second sense amplifier further comprises turning on an N-sense amplifier in response to the second sense amplifier control signal.

7. A differential sense amplifier, comprising:
   a first sense amplifier, electrically coupled to first and second nodes and also electrically coupled to a first control signal;
   a second sense amplifier, electrically coupled to the first and second nodes and also electrically coupled to a second control signal;
   a first capacitor, electrically coupled between the first control signal and the first node; and
   a second capacitor, electrically coupled between the first control signal and the second node.

8. The differential sense amplifier of claim 7, wherein the first sense amplifier is a P-sense amplifier comprising:
   a first p-channel field-effect transistor having a source terminal electrically coupled to the first control signal, and having a drain terminal electrically coupled to the first node, and having a gate terminal electrically coupled to the second node; and
   a second p-channel field-effect transistor having a source terminal electrically coupled to the first control signal, and having a drain terminal electrically coupled to the second node, and having a gate terminal electrically coupled to the first node.

9. The differential sense amplifier of claim 7, wherein the second sense amplifier is an N-sense amplifier comprising:
   a first n-channel field-effect transistor having a source terminal electrically coupled to the second control signal, and having a drain terminal electrically coupled to the first node, and having a gate terminal electrically coupled to the second node; and
   a second n-channel field-effect transistor having a source terminal electrically coupled to the second control signal, and having a drain terminal electrically coupled to the second node, and having a gate terminal electrically coupled to the first node.

10. The differential sense amplifier of claim 7, wherein the first and second capacitors have substantially equal capacitance values.

11. The differential sense amplifier of claim 7, wherein each of the first and second capacitors comprises:
    a polysilicon terminal electrically coupled to the respective first and second nodes;
    a diffusion terminal electrically coupled to the first control signal; and
    a dielectric interposed between the polysilicon and diffusion terminals.

12. The differential sense amplifier of claim 11, wherein each of the first and second capacitors comprises a field dielectric interposed between the polysilicon and diffusion terminals.

13. The differential sense amplifier of claim 11, wherein each of the first and second capacitors comprises a gate dielectric interposed between the polysilicon and diffusion terminals.

14. The differential sense amplifier of claim 11, wherein the dielectric interposed between the polysilicon and diffusion terminals comprises silicon dioxide.

15. The differential sense amplifier of claim 7, wherein the first node comprises a true digit line of a memory and the second node comprises a complementary digit line of the memory.

16. The differential sense amplifier of claim 15, wherein the true and complimentary digit lines each have a capacitance to a substrate of approximately $250 \times 10^{-15}$ Farads.

17. The differential sense amplifier of claim 15, wherein the first and second capacitors each have a capacitance of approximately between $3 \times 10^{-15}$ Farads and $7 \times 10^{-15}$ Farads.

18. A memory device, comprising:
   a plurality of memory cells, each memory cell electrically coupled to one of a true and complementary digit line;
   a differential amplifier electrically coupled to the true digit line and the complimentary digit line, the differential amplifier including:
      a first sense amplifier, electrically coupled to the true and complementary digit lines and also electrically coupled to a first control signal;
      a second sense amplifier, electrically coupled to the true and complementary digit lines and also electrically coupled to a second control signal;
      a first capacitor, electrically coupled between the first control signal and the true digit line; and
      a second capacitor, electrically coupled between the second control signal and the complementary digit line.

19. The memory device of claim 18, wherein the first and second capacitors have substantially equal capacitance values.

20. The memory device of claim 18, wherein each of the first and second capacitors comprises:
   a polysilicon terminal electrically coupled to the respective true and complementary digit lines;
   a diffusion terminal electrically coupled to the first control signal; and
   a dielectric interposed between the polysilicon and diffusion terminals.

21. The differential sense amplifier of claim 18, wherein each of the first and second capacitors comprises a field dielectric interposed between the polysilicon and diffusion terminals.

22. The differential sense amplifier of claim 18, wherein each of the first and second capacitors comprises a gate dielectric interposed between the polysilicon and diffusion terminals.

23. The differential sense amplifier of claim 18, wherein the dielectric interposed between the polysilicon and diffusion terminals comprises silicon dioxide.

24. The differential sense amplifier of claim 18, wherein the true and complimentary digit lines each have a capacitance to a substrate of approximately $250 \times 10^{\times 15}$ Farads.

25. The differential sense amplifier of claim 18, wherein the first and second capacitors each have a capacitance of approximately between $3 \times 10^{-15}$ Farads and $7 \times 10^{-15}$ Farads.

* * * * *

UNITED STATES PATENT AND TRADEMARK OFFICE
CERTIFICATE OF CORRECTION

PATENT NO. : 5,905,686

DATED : May 18, 1999

INVENTOR(S) : George B. Raad

It is certified that error appears in the above-identified patent and that said Letters Patent is hereby corrected as shown below:

At Col. 12, line 25, please delete "$10^{x15}$" and insert --$10^{-15}$--.

Signed and Sealed this

Ninth Day of November, 1999

*Attest:*

Q. TODD DICKINSON

*Attesting Officer*  Acting Commissioner of Patents and Trademarks